United States Patent [19]

Kaiser

[11] 3,818,582

[45] June 25, 1974

[54] METHODS OF PRODUCING FIELD EFFECT TRANSISTORS HAVING INSULATED CONTROL ELECTRODES

[75] Inventor: Reinhold Kaiser, Heilbronn, Germany

[73] Assignee: Licentia Patent Verwaltungs GmbH, Frankfurt am Main, Germany

[22] Filed: Mar. 4, 1971

[21] Appl. No.: 120,917

[30] Foreign Application Priority Data

May 5, 1970 Germany .......................... 2021923

[52] U.S. Cl. .................................... 29/571, 29/578

[51] Int. Cl. ............................................ B01j 17/00

[58] Field of Search .............................. 29/571, 578

[56] References Cited

UNITED STATES PATENTS

| | | | |
|---|---|---|---|
| 3,475,234 | 10/1969 | Kerwin et al. | 29/571 |
| 3,514,844 | 6/1970 | Bower | 29/571 |
| 3,528,168 | 9/1970 | Adamic | 29/571 |
| 3,529,347 | 9/1970 | Ingless | 29/571 |
| 3,566,518 | 3/1971 | Brown | 29/571 |
| 3,574,010 | 4/1971 | Brown | 29/571 |
| 3,625,647 | 12/1971 | Reuter | 29/576 |

*Primary Examiner*—W. C. Tupman
*Attorney, Agent, or Firm*—Spencer & Kaye

[57] ABSTRACT

A method of producing a field effect transistor having an insulated gate electrode in which at least one surface of a semi-conductor body is covered with an insulating layer, a region of the insulating layer is covered with a metal layer to form the gate electrode and contact-making windows are introduced into the insulating layer to make contact with a source and drain electrode provided in the semi-conductor body.

9 Claims, 16 Drawing Figures

Inventor:
Reinhold Kaiser
BY Spencer & Kaye
ATTORNEYS.

Inventor:
Reinhold Kaiser
BY Spencer & Kaye
ATTORNEYS.

METHODS OF PRODUCING FIELD EFFECT TRANSISTORS HAVING INSULATED CONTROL ELECTRODES

BACKGROUND OF THE INVENTION

The invention relates to a method of producing a field effect transistor with an insulated control or gate electrode, wherein contact-making windows are introduced into the insulating layer, at one surface of the semiconductor body, for making contact to source and drain electrodes in the semiconductor body.

SUMMARY OF THE INVENTION

The object of the invention is to provide a method of producing a field effect transistor having an insulated gate electrode, in which at least the region of the insulating layer provided for the control or gate electrode is covered with a metal layer.

The invention has the advantage that the threshold voltage of the field effect transistor is reduced and in addition, the field effect transistor is rendered more stable.

According to a further object of the invention, a getter or passivating layer is provided on the insulating layer, before the application of the metal layer as an intermediate layer between the insulating layer and the metal layer, for example to getter impurities out of the insulating layer. Such a getter or passivation layer may consist, for example, of doped silicon oxide, silicon nitride, aluminium oxide or oxides or nitrides of other elements.

According to another object of the invention, the metal layer is applied to the whole of one surface, for example by vapour-deposition. In this case, the contact-making windows for the source and drain are introduced through the metal layer and, when an intermediate layer is used, also through the intermediate layer, into the insulating layer beneath. The making of contact to the source and drain may be affected, for example, by structured application of the source electrode and the drain electrode, or by applying a (second) metal layer, covering the whole of one surface, from which metal layer the source electrode and the drain electrode are produced.

The electrodes are preferably obtained by structured etching out of the metal layers, the parts of the metal layers which are not needed for the electrodes being removed in a structured manner, for example by means of the photo-lacquer etching technique.

The metal layers may consist, for example, of aluminium, gold, chromium, titanium or platinum. The same or a different material may be used for the electrode material as for the metal intermediate layer provided according to the invention.

BRIEF DESCRIPTION OF THE DRAWINGS

The invention will be further described, by way of example, with reference to the accompanying drawings, in which.

In the drawings, like parts are denoted by like reference numerals.

DESCRIPTION OF PREFERRED EMBODIMENTS

Figure 1:
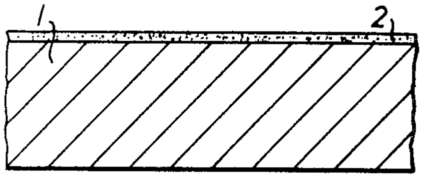
FIGS. 1 to 11 are vertical sections showing stages in the production of one embodiment of a field effect transistor according to the invention.

Referring first to FIG. 1 of the drawings, the starting point in the production of a field effect transistor according to the invention is a semiconductor body 1 of silicon for example, one surface of which is covered with an insulating layer 2 which consists, for example, of silicon dioxide or of silicon nitride. If, in the finished field effect transistor, the source electrode or the drain electrode is to extend out of the contact-making window in question to the surface of the insulating layer 2, it is advisable to make the insulating layer 2 relatively thick in order to keep the inevitable capacitance between the electrode parts extending over the insulating layer and the semiconductor body as low as possible and to obtain a high field threshold voltage. The thickness of the insulating layer 2 may amount to 1.5 $\mu$ in this case for example.

Figure 2:
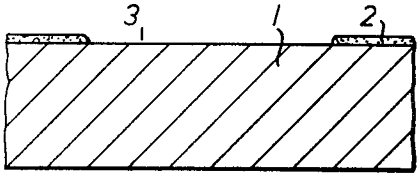
Figure 3:
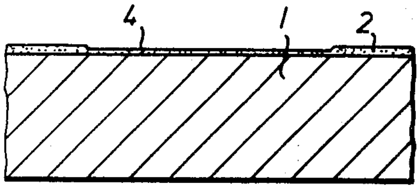

Since such thick insulating layers are unsuitable for making direct contact to semiconductor regions, however, because they are too thick for the production of contact-making windows, the insulating layer 2 is removed in the contact-making region, that is to say in the region of the source and drain as well as of the insulated gate electrode, as shown in FIG. 2, and replaced, in the region of the resulting aperture 3 as shown in FIG. 3, by a thinner insulating layer 4 which may likewise consist of silicon dioxide or silicon nitride for example. The insulating layer 4 may have a thickness of only 0.8 $\mu$ for example and is thus considerably thinner than the insulating layer 2. On the other hand, if no attention has to be paid to the electrode capacitances and the field threshold voltage, the insulating layer 2 is made as thin as the insulating layer 4 from the beginning so that in this case it is unnecessary to replace the insulating layer 2 by the insulating layer 4 in a specific region.

Figure 4:
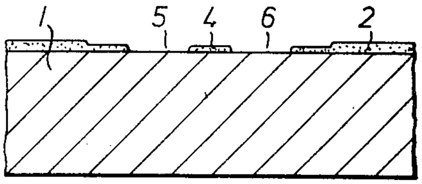
Figure 5:
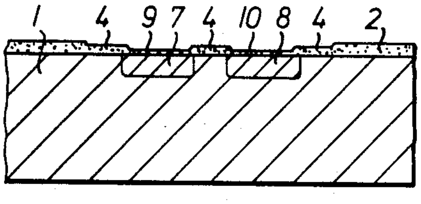

After formation of the insulating layer 4, the source and drain which are necessary for the field effect transistor are produced in the semiconductor body 1. First the diffusion windows 5 and 6 are introduced into the insulating layer 4, as shown in FIG. 4. The semiconductor region 7 is diffused through window 5 as a source and the semiconductor region 8 through window 6 as a drain in the semiconductor body 1, as shown in FIG. 5. The diffusion of the semiconductor regions 7 and 8 is preferably effected in an oxidizing atmosphere so that, in this case, the diffusion windows 5 and 6 are closed again by the insulating layers 9 and 10 during the diffusion.

Figure 6:
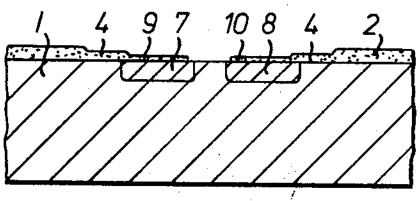
Figure 7:
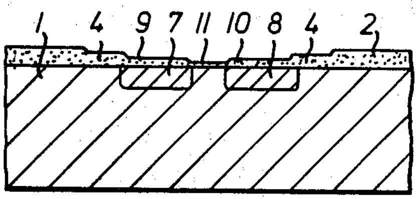

The finished field effect transistor which, in the particular case where an oxide layer is used as an insulating layer for the gate electrode is known as an MOS transistor, needs for its operation, apart from the source 7 and the drain 8, an insulated gate electrode which could be produced by direct application of gate-electrode material to the existing insulating layer. In general, however, the insulating layer present on the semiconductor surface during the diffusion does not satisfy the requirements regarding purity which have to be made with regard to an insulating layer for the gate electrode of a field effect transistor. The insulating layer on the semiconductor surface is therefore removed, at least in the gate-electrode region, after the diffusion, as shown in FIG. 6, and replaced by a fresh insulating layer 11 as shown in FIG. 7.

Figure 8:
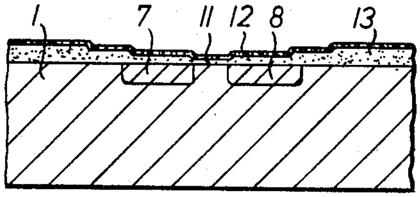

According to the invention, before the contact-making windows are produced, the insulating layer present on the semiconductor surface is covered, as shown in FIG. 8, with a metal layer 12 which is present, at least in the gate-electrode region and consists, for example, of aluminium. In the example of an embodiment in FIG. 8, the metal layer 12 extends, however, over one entire surface and so covers the total insulating layer on this one surface, which is composed of the insulating layers 2, 4, 9, 10 and 11 and is now designated by the reference numeral 13 in FIG. 8. A metal layer 12 covering the whole of one surface may naturally be applied without a mask, for example by vapour-deposition.

Figure 9:
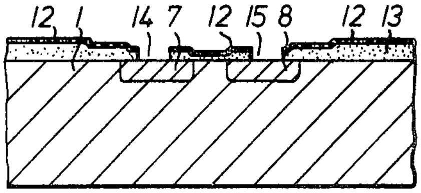
Figure 10:
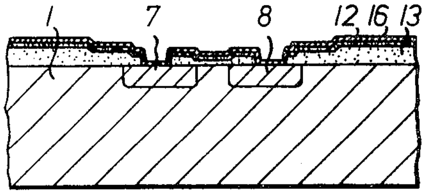
Figure 11:
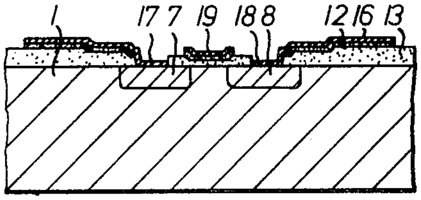

The contact-making windows for the source 7 and the drain 8 are produced, for example, as shown in FIG. 9, by removing the metal layer 12 in the region of the contact-making windows and introducing the contact-making windows 14 and 15 into the insulating layer 13 beneath. This is effected, for example, by structured etching by means of a photolacquer etching technique. Finally, in order to produce the source electrode and drain electrode, a second metal layer 16 is applied to the surface thus prepared and, as shown in FIG. 10, covers the first metal layer 12 as well as the semiconductor surface in the region of the window apertures. The source and drain electrodes 17 and 18 are obtained, as shown in FIG. 11, from the metal layers, by structured removal of the parts of the metal layers not needed for the electrodes. The gate electrode 19 is produced at the same time.

The production of the field effect transistor electrodes is preferably effected by structured etching. Naturally, it would also be possible in principle to apply the finished electrodes in structured manner from the beginning instead of the second metal layer 16 covering the whole area. The application of the metal layer 16 covering the whole area with subsequent structured etching of the electrode structures is a simpler method, however, technically.

As FIG. 11 shows, the source electrode 17 and the drain electrode 18 each extend laterally over the insulating layer 13. In this case, between the parts of the source and drain electrodes and of the insulating layer projecting from the contact-making windows, there are parts of the first metal layer 12 which may also be regarded as part of the electrodes. As a result of the fact that the insulating layer 2 originally applied was selected relatively thick and consequently the resulting insulating layer 13 is correspondingly thick over a substantial portion of the area covered by the source electrode and the drain electrode, relatively satisfactory shielding of the source electrode and of the drain electrode is obtained in relation to the semiconductor body.

Figure 12:
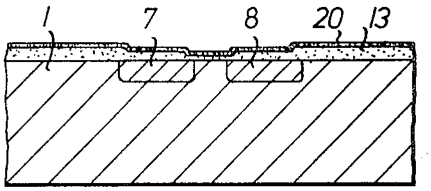
FIGS. 12 to 16 are vertical sections showing stages in the production of a second embodment of a field effect transistor according to the invention.
Figure 13:
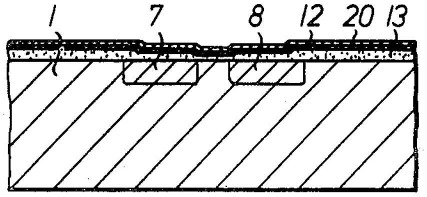
Figure 14:
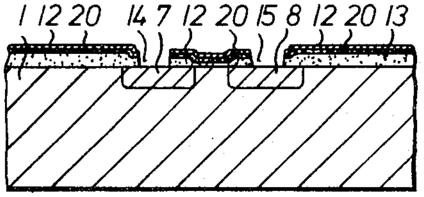
Figure 15:
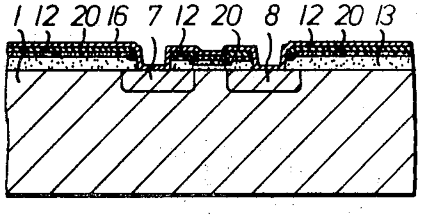
Figure 16:
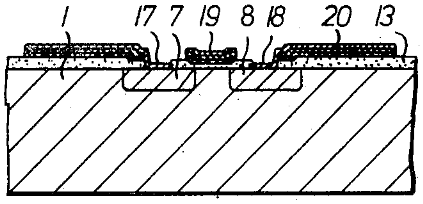

The embodiment shown in FIGS. 12 to 16 differs from the embodiment shown in FIGS. 1 to 11 only in that, according to FIG. 12, an intermediate layer 20, which consists of a doped silicon oxide or of nitride for example and has the property of a getter or passivating layer, is provided between the metal layers 12 and the insulating layer 13. With appropriate heat treatment, impurities are gettered out of the insulating layer 13 by the intermediate layer 20. When such an intermediate layer 20 is used, the (first) metal layer 12 is thus not applied directly to the insulating layer 13 but to the intermediate layer 20 previously applied, which in the majority of cases is likewise an insulating layer. Apart from the intermediate layer 20, the stages shown in FIGS. 12 to 16 correspond completely to those in 7 to 11.

It will be understood that the above description of the present invention is susceptible to various modifications changes and adaptations.

What is claimed is:

1. A method for producing an insulated gate field effect transistor in a semiconductor body comprising the steps of: forming an insulating layer on one surface of the semiconductor body; opening spaced diffusion windows within the insulating layer for the diffusion of source and drain regions into the semiconductor body; diffusing source and drain regions into the semiconductor body; covering said surface of the semiconductor body with an insulating layer; applying a metal layer over the entire surface of the insulating layer including that region of the insulating layer over which the gate electrode is to be formed opening contact-making windows within the metal layer and the insulating layer for the source and drain regions; and producing source and drain electrodes within the contact-making windows and a gate electrode, said step of producing including applying a second metal layer both to said metal layer and within said contact-making windows and selectively removing portions of the two metal layers which are not needed for the electrodes for producing the gate electrode and said source and drain electrodes.

2. A method as claimed in claim 1, further comprising the step of: following said step of diffusing, removing at least the portion of the insulating layer in the region of the gate electrode; and wherein said step of covering the semiconductor body with an insulating layer includes replacing the removed portion of the insulating layer with a fresh insulating layer.

3. A method as claimed in claim 1, in which the metal layer is selected from the group consisting of aluminium, gold, chromium, titanium and platinum.

4. A method for producing an insulated gate field effect transistor in a semiconductor body comprising the steps of: forming an insulating layer on one surface of the semiconductor body; opening spaced diffusion windows within the insulating layer for the diffusion of source and drain regions into the the semiconductor body; diffusing source and drain regions into the semiconductor body; covering said surface of the semiconductor body with an insulating layer; subsequent to the step of covering the surface of the semiconductor body with an insulating layer, applying a getter or passivating layer to the insulating layer as an intermediate layer; applying a metal layer over the entire surface of the intermediate layer including that region of the intermediate layer over which the gate electrode is to be formed; opening contact making windows within the metal layer, the intermediate layer and the insulating layer for the source and drain regions; and producing source and drain electrodes within the contact-making windows and a gate electrode, said step of producing including applying a second metal layer both to said metal layer and within said contact-making windows and selectively removing portions of the two metal layers which are not needed for said electrodes for producing the gate electrode and said source and drain electrodes.

5. A method as claimed in claim 4, further comprising following said step of diffusing, removing at least the portion of the insulating layer, in the region of the gate electrode and wherein said step of covering the semiconductor body with an insulating layer includes replacing the removed portion of the insulating layer with a fresh insulating layer for the gate electrode prior to the application of said intermediate layer.

6. A method as claimed in claim 4, in which said intermediate layer consists of an oxide.

7. A method as claimed in claim 6, in which the oxide is doped silicon oxide.

8. A method as claimed in claim 4, in which said intermediate layer consists of a nitride.

9. A method as claimed in claim 8, in which the nitride is silicon nitride.

* * * * *